(12) United States Patent
Matsuhashi et al.

(10) Patent No.: US 9,349,674 B2
(45) Date of Patent: May 24, 2016

(54) WIRING BOARD UNIT, MANUFACTURING METHOD THEREOF, AND MANUFACTURING METHOD OF WIRING BOARD WITH LEAD

(71) Applicant: NGK SPARK PLUG CO., LTD, Nagoya, Aichi (JP)

(72) Inventors: Kensuke Matsuhashi, Kounan (JP); Sadahiro Nishimura, Ichinomiya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 37 days.

(21) Appl. No.: 14/283,642

(22) Filed: May 21, 2014

(65) Prior Publication Data

US 2014/0353024 A1    Dec. 4, 2014

(30) Foreign Application Priority Data

May 28, 2013    (JP) ................. 2013-111523

(51) Int. Cl.
| | |
|---|---|
| *H05K 13/00* | (2006.01) |
| *H05K 1/11* | (2006.01) |
| *H01L 23/495* | (2006.01) |
| *H05K 3/00* | (2006.01) |
| *H05K 3/24* | (2006.01) |
| *H01L 23/48* | (2006.01) |
| *H01L 21/56* | (2006.01) |

(52) U.S. Cl.
CPC .... *H01L 23/49503* (2013.01); *H01L 23/49506* (2013.01); *H01L 23/49531* (2013.01); *H01L 23/49544* (2013.01); *H01L 23/49548* (2013.01); *H01L 23/49551* (2013.01); *H01L 23/49582* (2013.01); *H05K 3/0097* (2013.01); *H05K 3/244* (2013.01); *H01L 21/561* (2013.01); *H01L 23/49575* (2013.01); *H01L 2224/48091* (2013.01); *H01L 2924/15192* (2013.01); *H05K 2201/09127* (2013.01); *H05K 2201/10204* (2013.01); *H05K 2203/0169* (2013.01); *H05K 2203/304* (2013.01); *Y10T 29/49147* (2015.01)

(58) Field of Classification Search
CPC .................................. H05K 13/00; H05K 1/11
USPC .................................................. 174/250, 251
See application file for complete search history.

(56) References Cited

U.S. PATENT DOCUMENTS 4,482,915 A * 11/1984 Nishikawa .......... H01L 23/3107
257/667
5,162,895 A * 11/1992 Takahashi ......... H01L 23/49541
257/670

(Continued)

FOREIGN PATENT DOCUMENTS

JP    2001-156215 A    6/2001

*Primary Examiner* — Timothy Thompson
*Assistant Examiner* — Michael F McAllister
(74) *Attorney, Agent, or Firm* — Stites & Harbison, PLLC; Jeffrey A. Haeberlin; James R. Haynes

(57) ABSTRACT

A wiring board unit includes: a polygonal wiring board having three or more sides in top view, a product insulating part comprising a plurality of external terminals, and a dummy insulating part at an outer edge of one of the at least three sides; and a lead frame including a frame having an inner edge defining an opening within which the wiring board is disposed in top view, and a plurality of leads, one end of each of the plurality of leads connected to the inner edge of the frame and the other end of each of the plurality of leads respectively connected to one of the plurality of external terminals of the wiring board, wherein a connection unit for connecting the frame of the lead frame and the dummy insulating part of the wiring board is arranged therebetween.

4 Claims, 11 Drawing Sheets

(56) References Cited

U.S. PATENT DOCUMENTS

| | | | |
|---|---|---|---|
| 5,530,284 A * | 6/1996 | Bailey | H01L 23/49562 257/666 |
| 5,671,531 A * | 9/1997 | Mugiya | H01L 21/4853 257/E21.525 |
| 5,841,187 A * | 11/1998 | Sugimoto | H01L 23/49541 257/666 |
| 6,703,284 B2 * | 3/2004 | Barkhordarian | H01L 27/0605 257/E21.697 |
| 6,703,695 B2 * | 3/2004 | Nakazawa | 257/676 |
| 2009/0133902 A1 * | 5/2009 | Kim | H05K 1/111 174/250 |

* cited by examiner

36

38

WIRING BOARD UNIT, MANUFACTURING METHOD THEREOF, AND MANUFACTURING METHOD OF WIRING BOARD WITH LEAD

CROSS-REFERENCE TO RELATED APPLICATION

This application claims priority from Japanese Patent Application No. 2013-111523 filed with the Japan Patent Office on May 28, 2013, the entire content of which is hereby incorporated by reference.

BACKGROUND OF THE INVENTION

1. Field of the Invention

The present disclosure relates to a wiring board unit including a wiring board and a lead frame having the wiring board within an opening, a manufacturing method of the wiring board unit, and a manufacturing method of a wiring board with lead obtained subsequently to the manufacturing method of the wiring board unit.

2. Description of Related Art

For example, Japanese Patent Application Laid-open No. 2001-156215 (Pages 1 to 8, FIGS. 1 to 4) proposes a technique for obtaining a ceramic package. In this technique, the resulting ceramic package includes a lead frame and a ceramic board. The lead frame has a plurality of lead units extending in parallel with each other from one side of an opening having a rectangular shape in top view to inside of the opening. In the ceramic board, a terminal is fixed at each end of the lead units by brazing. Furthermore, this ceramic board is supported in a cantilever manner at the required position within the opening. A seal ring is fixed on a primary surface of a ceramic layer of the ceramic board. Outer shape of the seal ring is used as the reference of the position recognition to mount a semiconductor device on the ceramic board. Thus, the ceramic package superior in mounting accuracy and productivity can be obtained.

In the ceramic package disclosed in Japanese Patent Application Laid-open No. 2001-156215, however, the leads within the opening of the lead frame are configured to support the ceramic board in a cantilever manner. Such a configuration of the ceramic package may cause matters as described below. That is, a plating step is performed after a mounting step for mounting the ceramic board to the lead frame. In the plating step, the surface of the terminal and/or the leads of the ceramic board are covered with a metal plating film. In this plating step, the ceramic board tends to swing in a flowing plating solution. Thus, the leads may be bent and deformed. In particular, when the leads are thin and small in width, the leads is more likely to be bent and deformed. As a result, defect products could be caused in the resultant wiring board unit or leaded wiring board that is a lead frame with the wiring board.

BRIEF SUMMARY OF THE INVENTION

A wiring board unit includes: a polygonal wiring board having three or more sides in top view, a product insulating part comprising a plurality of external terminals, and a dummy insulating part at an outer edge of one of the at least three sides; and a lead frame including a frame having an inner edge defining an opening within which the wiring board (i.e., at least one wiring board) is disposed in top view, and a plurality of leads, one end of which is connected to an inner edge of the opening of the frame and the other end of which is connected to a plurality of external terminals of the wiring board (i.e., one end of each of the plurality of leads is connected to the inner edge of the frame and the other end of each of the plurality of leads is respectively connected to one of the plurality of external terminals of the wiring board), wherein a connection unit for connecting the frame of the lead frame and the dummy insulating part of the wiring board is arranged therebetween.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Figure 1:
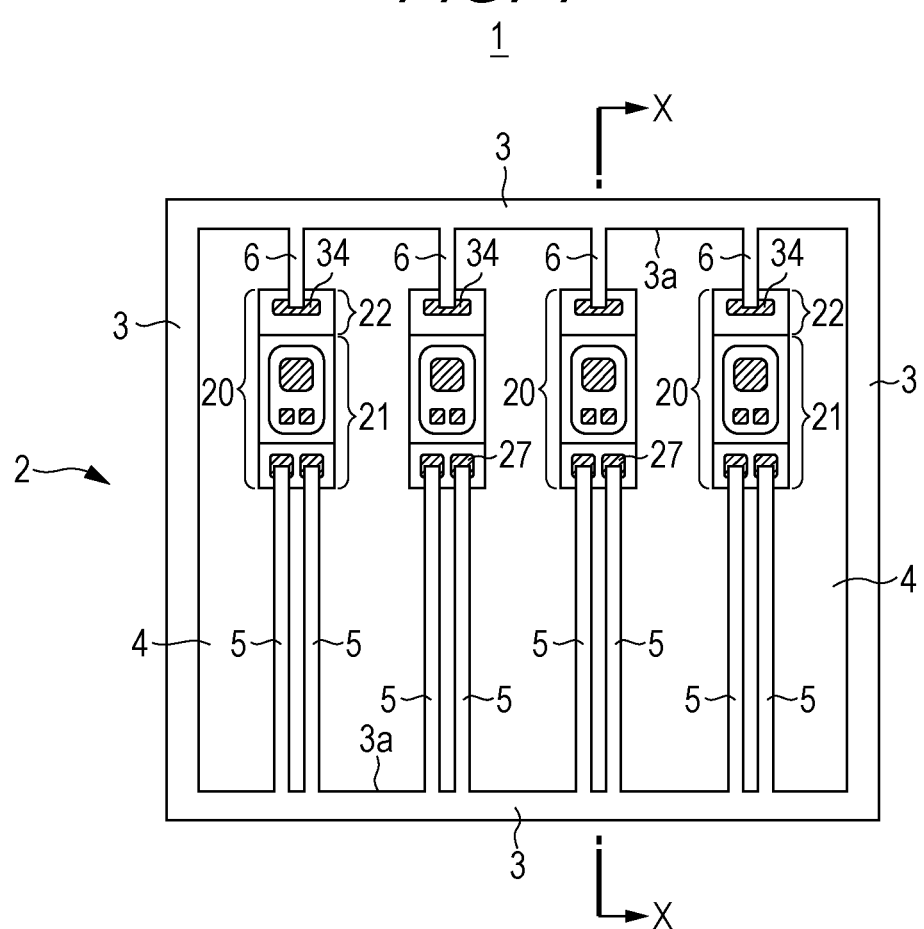
FIG. 1 is a top view of a wiring board unit according to an embodiment of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

One of the purposes of the present disclosure is to solve the problems described in the above Description of Related Art. One of the purposes of the present disclosure is to provide, for example, a wiring board unit in which a plurality of leads are unlikely to be bent in the plating step even when a wiring board arranged within an opening of a lead frame is mounted in a cantilever manner by a plurality of leads extending from an inner edge of the frame (also referred to herein as an inner edge of the opening), a manufacturing method of surely obtaining the wiring board unit, and a manufacturing method of a wiring board with lead subsequently obtained after the above manufacturing method.

The present disclosure has been made based on the concept that the wiring board is arranged to have a product insulating part having external terminals connected to a plurality of leads of a lead frame and a dummy insulating part excluding the product insulating part, and that the dummy insulating part and the frame of the lead frame are connected via a connection unit.

That is, according to an aspect of the present invention, the wiring board unit includes: a polygonal wiring board having three or more sides in top view (i.e., a wiring board having at least three sides and a polygonal shape in top view); and a lead frame including a frame having an opening within which the wiring board (at least one wiring board) is disposed in top view, and a plurality of leads, one end of which is connected to an inner edge of the opening of the frame and the other end of which is connected to a plurality of external terminals of the wiring board (i.e., one end of each of the plurality of leads is connected to the inner edge of the frame and the other end of each of the plurality of leads is respectively connected to one of the plurality of external terminals of the wiring board), wherein the wiring board has a product insulating part on a surface of which the plurality of external terminals are formed and a dummy insulating part formed at an outer edge including one side of the polygon (i.e., the wiring board includes a product insulating part comprising a plurality of external terminals, and a dummy insulating part at an outer edge of one of the at least three sides), and wherein a connection unit for connecting the frame of the lead frame and the dummy insulating part of the wiring board is arranged therebetween.

According to the above, the wiring board is disposed within the opening inside of the frame. In this wiring board, a plurality of external terminals formed on the surface of the product insulating part of the wiring board are connected to the ends of the plurality of leads extending from the inner edge of the opening. Furthermore, the dummy insulating part of the wring board is connected to the inner edge of the frame via the connection unit. As a result, this allows preventing or significantly suppressing such situation at the manufacturing that the wiring board swings in the plating solution due to the flow of the plating solution in the plating step that is performed after the mounting step for mounting the wiring board within the opening of the frame. Further, the bending of the leads is also prevented or suppressed, when the lead frame is connected to or removed from the plating electrode (the power supply), on which the wiring board is mounted. Furthermore, such deformation that the plurality of leads connected to the product insulating part of the wiring board is undesirably bent is unlikely to occur after the mounting step and/or at the conveyance between respective steps.

This ensures to provide the wiring board unit that has the lead frame and the wiring board and is superior in the morphological stability and the dimensional accuracy. In the wiring board of the wiring board unit, the product insulating part is connected to a plurality of leads extending inward the opening inside the frame. Moreover, the dummy insulating part is connected to the inner edge of the frame via the connection unit.

It is noted that the product insulating part and the dummy insulating part of the wiring board include ceramic such as alumina or resin such as epoxy-based resin, for example.

Further, the wiring board is shaped in a regular polygon (for example, a square, a hexagon, an octagon) in the top view or an irregular polygon (such as a rectangle, an irregular octagon) having more than or equal to three sides.

Furthermore, the dummy insulating part of the wiring board is an insulating part that includes at least one side of the polygon forming the outer shape of the wiring board and neighbors the product insulating part. Furthermore, the dummy insulating part is the insulating part that has the least necessary area for arranging the connection unit. Therefore, the dummy insulating part has a relatively small area compared to the product insulating part in top view. On the other hand, the product insulating part of the wiring board is an insulating part that includes two or more sides of the polygon and excludes the dummy insulating part.

Further, a dividing groove or the necessary number of through holes may be provided in the back surface, for example, of the wiring board along the border between the dummy insulating part and the product insulating part. The through hole penetrates the wiring board from its front surface to its back surface.

Furthermore, the external terminals of the wiring board may be formed to the thin part of the product insulating part.

Further, the lead frame is made by punching of a thin plate in a predetermined pattern. The material of the thin plate may be Alloy 42 (Fe-42% Ni), copper alloy such as 194 alloy (Cu-2.3% Fe-0.03% P), Kovar (Fe-29% Ni-17% Co), or stainless steel.

Furthermore, the outer shape of the frame of the lead frame and the opening located inside may be arranged to be the similar figure to each other and be a regular polygon or an irregular polygon having more than or equal to three sides, or arranged to be the similar figure to each other and be a circle, an oval, or an ellipse in top view.

Further, when the opening in top view is a regular polygon or an irregular polygon, a plurality of leads of the lead frame may extend in the following manner. That is, the plurality of leads may extend in parallel with each other within the opening from the same side of the inner edge of the frame forming the opening and extend in parallel toward the same side of the product insulating part in the same wiring board. Also, the leads may extend in parallel with each other. Further, the plurality of leads may extend obliquely from the same side of the inner edges of the frame toward the same or different side of the product insulating part in the same wiring board so as to be close to each other. Alternatively, the plurality of leads may extend along the different directions from the different sides of the inner edge of the frame respectively, and extend arbitrarily toward the different sides of the product insulating part in the same wiring board.

Furthermore, the total number of the plurality of leads is at least two.

In addition, a plurality of the wiring boards may be disposed straight in top view within the opening of the lead frame. Furthermore, a plurality of the wiring boards may be disposed in a lattice manner or a staggered manner in top view within the opening of the lead frame.

In an implementation of the wiring board, the connection unit is any one of a connection lead extending inward in the opening from the inner edge of the opening of the frame and jointed (i.e., joined) to a conductor provided to the dummy insulating part (i.e., a conductor of the dummy insulating part) of the wiring board, an abutting lead extending inward in the opening from the inner edge of the opening of the frame and having an end abutted on a plurality of outer circumference surfaces of the dummy insulating part, a clipping lead extending inward in the opening from the inner edge of the opening of the frame and clipping the dummy insulating part in a thickness direction, and a protruding lead extending inward in the opening from the inner edge of the opening of the frame and having an end inserted to (i.e., inserted in) a recess opened outward of the dummy insulating part (i.e., a recess opening away from the dummy insulating part and the wiring board).

According to the above, in the wiring board disposed within the opening of the frame, a plurality of external terminals formed in the surface of the product insulating part are connected to the ends of the plurality of leads extending from the inner edge of the frame. Furthermore, the dummy insulating part of the wiring board and the frame are connected via the connection unit of any one of the connection lead, the abutting lead, the clipping lead, and the combination of the recess and the protruding lead. As a result, this wiring board unit allows prevention or suppression of bending deformation of the plurality of leads in the plating step and the undesired deformation of the leads after the mounting step at the manufacturing.

It is noted that the conductor formed in the dummy insulating part of the wiring board includes at least one conductive layer. The conductive layer is made of, for example, W or Mo that is the same as the external terminal. The conductor and the end of the connection lead are jointed by a brazing or a spot welding.

Further, the abutting lead may be a form extending in a Y-shape, a V-shape, or a U-shape from the inner edge of the opening of the lead frame in top view. The inner part of the abutting lead and the outer circumference of the dummy insulating part are connected to each other by the friction therebetween.

Furthermore, the clipping lead may be formed by providing a slit at the end side of the band-shaped lead piece extending from the inner edge of the opening of the frame and deforming one or both of the pair of lead pieces divided by the slit along the thickness direction. Alternatively, the clipping lead may be formed by overlapping and jointing another lead piece on the surface of the band-shaped lead piece so that they form a ">" shape in side view, for example. The outer circumference of the dummy insulating part is interposed between two lead pieces with their ends opened in the thickness direction.

Further, the recess provided in the dummy insulating part is a cavity or a recessed groove opened toward the outer circumference surface. The tapered end of the protruding lead enters the cavity. The end of the protruding lead shaped in a thin rectangle in top view enters the recessed groove. This allows the both to be connected.

Furthermore, the abutting lead, the clipping lead, or the protruding lead does not overlap the plurality of leads in top view. Moreover, the abutting lead, the clipping lead, or the protruding lead extends inward in the opening from the different side of the inner edge of the frame or the inner edges located separated to each other in the frame.

In addition, the connection unit may be a connecting piece made of metal or resin, for example, interposed between the frame and the dummy insulating part. Both ends of the connecting piece may be connected to the frame and the dummy insulating part by the joint with a brazing or by an adhesive agent.

Another aspect of the present invention is a method of manufacturing a wiring board unit including a polygonal wiring board having three or more sides in top view (i.e., a wiring board having at least three sides and a polygonal shape in top view), and a lead frame including a frame having an opening within which the wiring board (i.e., at least one wiring board) is disposed in top view and a plurality of leads, one end of which is connected to an inner edge of the opening of the frame and the other end of which is connected to a plurality of external terminals of the wiring board (i.e., one end of each of the plurality of leads is connected to the inner edge of the frame and the other end of each of the plurality of leads is respectively connected to one of the plurality of external terminals of the wiring board). The method includes: preparing the lead frame; preparing the wiring board; mounting the wiring board within the opening of the frame by respectively jointing (i.e., joining) each of the plurality of external terminals of the wiring board to the one end of each of the plurality of leads; and coating a surface of the frame and a surface of the plurality of leads with a plating film by conducting (i.e., connecting) the frame of the lead frame jointed (i.e., joined) to the wiring board to a plating power source, wherein, in the mounting of the wiring board, a connection unit for connecting the inner edge of the opening of the frame and the dummy insulating part of the wiring board is arranged therebetween.

According to the above, with respect to the lead frame and the wiring board prepared in each above-described preparing step, the plurality of external terminals formed on the surface of the product insulating part of the wiring board are connected to the ends of the plurality of leads extending inward the opening of the frame in the mounting step. Furthermore, the dummy insulating part of the wiring board and the inner edge of the opening of the frame are connected via the connection unit. As a result, this allows preventing or significantly suppressing such situation that the wiring board swings in the plating solution due to the flow of the plating solution in the plating step. Furthermore, the bending of the leads is also prevented or suppressed in connecting and removing the lead frame, on which the wiring board is mounted, to and from the plating electrode (the power supply). Furthermore, such deformation that the plurality of leads connected to the product insulating part of the wiring board is undesirably bent is unlikely to occur after the mounting step and/or at the conveyance between respective steps.

This ensures to provide the wiring board unit that has the lead frame and the wiring board and is superior in the morphological stability and the dimensional accuracy. In the wiring board of the wiring board unit, the product insulating part is connected to the plurality of leads extending inward the opening inside the frame. Moreover, the dummy insulating part is connected to the inner edge of the frame via the connection unit.

It is noted that the plating step may include two plating steps for implementing an electro Ni plating and an electro Au plating.

In an implementation of the method of manufacturing, the connection unit is any one of a connection lead extending inward in the opening from the inner edge of the opening of the frame and jointed (i.e., joined) to a conductor provided to the dummy insulating part (i.e., a conductor of the dummy insulating part) of the wiring board, an abutting lead extending inward in the opening from the inner edge of the opening of the frame and having an end contacted to (i.e., abutted on) a plurality of outer circumference surfaces of the dummy insulating part, a clipping lead extending inward in the opening from the inner edge of the opening of the frame and clipping the dummy insulating part in a thickness direction, and a protruding lead extending inward in the opening from the inner edge of the opening of the frame and having an end inserted to (i.e., inserted in) a recess opened outward the dummy insulating part (i.e., a recess opening away from the dummy insulating part and the wiring board).

According to the above, in the mounting step, the plurality of external terminals formed on the surface of the product insulating part of the wiring board disposed within the opening of the frame can be connected to the ends of the plurality of leads extending from the inner edge of the opening. Furthermore, the dummy insulating part of the wiring board and the frame are connected via the connection unit of any one of the connection lead, the abutting lead, the clipping lead, and the combination of the recess and the protruding lead. This ensures facile, inexpensive and sure manufacturing of the wiring board unit that is able to prevent or suppress the bending deformation of the plurality of leads in the plating step and the undesired deformation of the leads after the mounting step.

In another implementation, the method of manufacturing further includes: cutting out the wiring board having the product insulating part only, by cutting at least a part of the frame to remove the plurality of leads from the frame (i.e., separate or sever the plurality of leads) and by removing the dummy insulating part from the wiring board.

This ensures providing a wiring board with lead(s) (hereinafter "wiring board with lead"). The wiring board with lead has the wiring board having the product insulating part only, and the plurality of leads whose one ends (tips) are jointed to the plurality of external terminals formed on the surfaces of that wiring board.

It is noted that the wiring board with lead may be such a form that a part of the frame closely adjacent to the base ends of the plurality of leads is shared. Furthermore, the wiring board with lead having the leads of desired lengths may be provided by cutting the base end position of each lead in such form of the wiring board with lead.

One form for implementing the present disclosure will be described below.

Figure 2A:
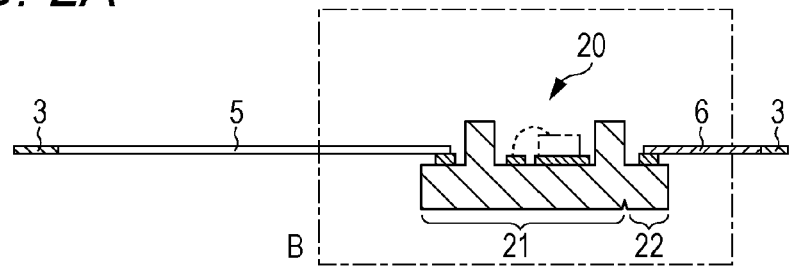
FIG. 2A is a vertical sectional view taken in the direction of arrows along line X-X in FIG. 1.
Figure 2B:
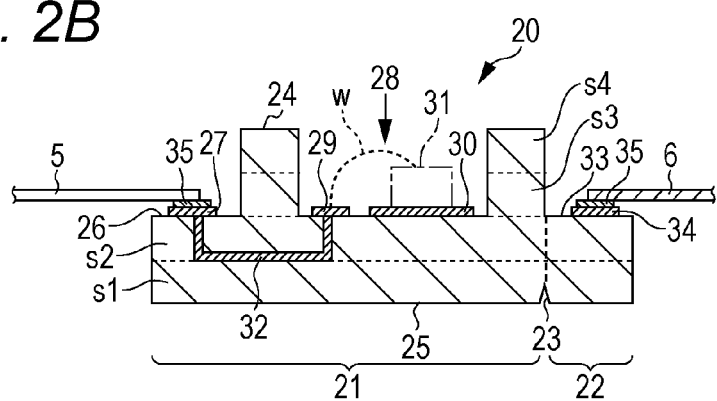
FIG. 2B is an exploded view of a dashed line portion B in FIG. 2A, and FIGS. 2C and 2D are top views of wiring board with lead obtained by the present disclosure.
Figure 2C:
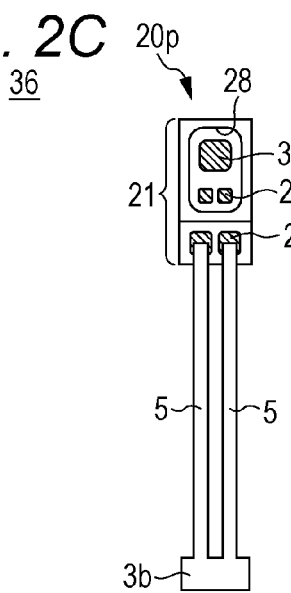
Figure 2D:
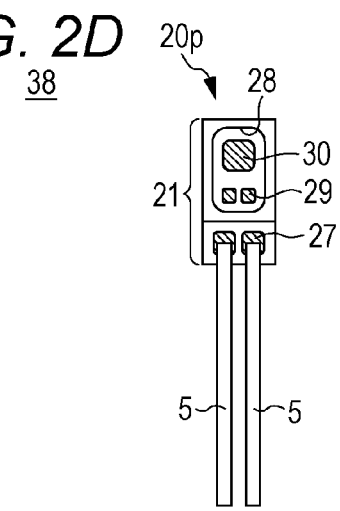

FIG. 1 is a top view of a wiring board unit 1 of one form according to the present disclosure. FIG. 2A is a vertical sectional view viewed along the arrow of an X-X line of FIG. 1. FIG. 2B is an exploded view of a dashed line portion B of FIG. 2A. FIGS. 2C and 2D are top views of a wiring board with lead obtained by the present disclosure.

As illustrated in FIG. 1, such wiring board unit 1 includes four (a plurality of) wiring boards 20 and a lead frame 2. The wiring board 20 has a rectangular (quadrangular) shape in top view. The lead frame 2 has an inner opening 4 in which the four wiring boards 20 are linearly arranged (in the horizontal direction in the figure).

The lead frame 2 is made of Alloy 42 having a thickness of, for example, approximately 0.1 to 0.2 mm. The lead frame 2 has a frame 3, a plurality of leads 5, and four connection leads 6. The frame 3 has a rectangular frame-shaped external form in top view and has an opening 4 that is a similar figure to that external form. Four sets of two (or more than one) mutually adjacent leads 5 extend vertically from an inner edge 3a of the lower side of the frame 3 in the opening 4. The connection leads 6 extend vertically from the inner edge 3a of the upper side of the frame 3 in the opening 4 so as to substantially face the respective sets of the leads 5.

On the other hand, as illustrated in FIG. 1, FIG. 2A, and FIG. 2B, the external form of the wiring board 20 is a vertical rectangle having four sides in top view. The wiring board 20 includes a product insulating part 21 occupying a relatively larger area and a dummy insulating part 22 occupying a relatively smaller area. These insulating parts 21 and 22 are formed by stacking, for example, ceramic layers s1 to s4 whose main component is alumina. Along the boundary between the parts 21 and 22 as illustrated by a virtual line in FIG. 2B, a dividing groove 23 having a V-shaped cross section is formed in the back surface of the wiring board 20.

The materials of the insulating parts 21 and 22 may include high temperature sintered ceramic such as mullite, low temperature sintered ceramic such as glass-ceramic, and resin insulating materials such as epoxy-based resin.

The product insulating part 21 is formed by stacking ceramic layers s3 and s4, which are shaped in a rectangular frame in top view, on the flat plate part of the ceramic layers s1 and s2. The product insulating part 21 has a surface 24 shaped in a rectangular frame in top view and a rectangular back surface 25. As illustrated in FIG. 1, FIG. 2A, and FIG. 2B, a pair of right and left (a plurality of) external terminals 27 are formed on a surface 26 of the thin part of the product insulating part 21. The ends of two leads 5 per set are respectively brazed (jointed) to the pair of the external terminals 27 via an Ag brazing material 35 or the like.

Further, inside the ceramic layers s3 and s4, a cavity 28 is formed whose bottom is the surface of the ceramic layer s2. The bottom is formed with a pair of right and left internal terminals 29 and an element mounting part 30 shaped in a rectangle in top view.

As illustrated in FIG. 2B, the pair of the external terminals 27 is conductive to the pair of the internal terminals 29 via a pair of internal wirings 32, respectively. Each of the internal wirings 32 in the pair includes a via-conductor penetrating the ceramic layer s2 and a wiring layer formed between the ceramic layer s1 and the ceramic layer s2.

Furthermore, a semiconductor device such as an IC chip and/or an electronic part 31 such as a light emitting element will be mounted on the surface of the element mounting part 30. The paired electrodes of the electronic part 31 will be conducted to the paired internal terminals 29 via wires w, respectively.

In addition, as illustrated in FIG. 1 and FIG. 2B, a lateral conductor 34 is formed on a surface 33 of the flat plate part including the ceramic layers s1 and s2 of the dummy insulating part 22. The end of the connection lead 6 is brazed to the conductor 34 via the same brazing material 35 as described above.

Furthermore, the external terminals 27, the internal terminals 29, the element mounting part 30, the internal wirings 32, and the conductor 34 may be made of W, Mo, or the like. Further, an internal wiring similar to one described above may be also provided between the element mounting part 30 and the conductor 34 of the dummy insulating part 22.

FIG. 2C is a top view of a wiring board with lead 36. The wiring board with lead 36 includes a wiring board 20p, a pair of leads 5, and a partial frame 3b. The wiring board 20p has the product insulating part 21 as an insulating member. The wiring board 20p is obtained by cutting and removing the dummy insulating part 22 from the wiring board unit 1. The partial frame 3b is a remaining part of the lower side of the frame 3 obtained by cutting the lower side of the frame 3 adjacent to the pair of the leads 5 at two points. From the wiring board unit 1, four wiring boards with lead 36 are obtained.

Further, a wiring board with lead 38 including a pair of leads 5 of a desired length as illustrated in FIG. 2D is obtained by cutting and removing the partial frame 3b and the adjacent base ends of the pair of the leads 5 from the wiring board with lead 36. The electronic part 31 is mounted on the surface of the element mounting part 30, and each electrode of the electronic part 31 are conducted respectively to the pair of the internal terminals 29 by the wires w, so that the wiring board with lead 38 can be arranged to a predetermined part in various electronic devices.

Figure 3:
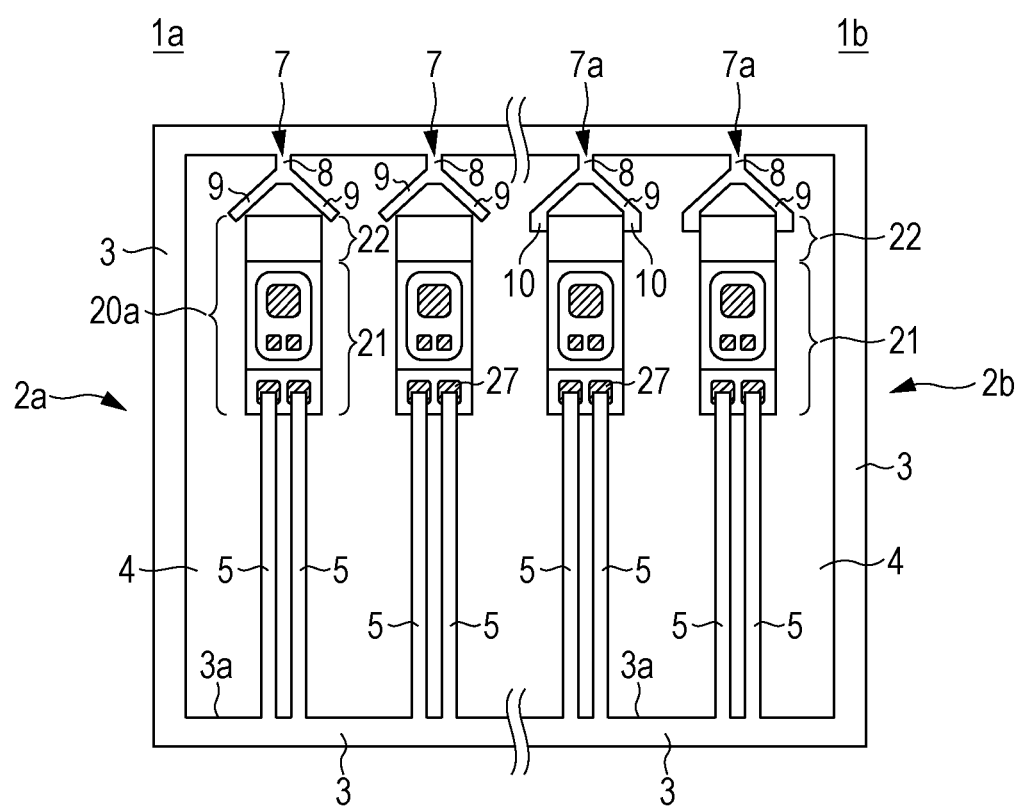
FIG. 3 is a top view of a different form of a wiring board unit.

FIG. 3 is a top view of two wiring board units 1a and 1b having the different forms.

One wiring board unit 1a has the same lead frame 2a as described above and the same plurality of wiring boards 20a as described above, as partially illustrated in the left side in FIG. 3. The wiring boards 20a are disposed within the opening 4 of the frame 3. The difference between the wiring board unit 1a and the wiring board unit 1 is in a lead frame 2a of the wiring board unit 1a. The lead frame 2a has abutting leads (a connection unit) 7 in place of the connection leads 6. Each abutting lead 7 extends from an inner edge 3a of the upper side of the frame 3 so as to have substantially a Y-shape in top view. Each abutting lead 7 is provided in the upper part of each wiring board 20. The abutting lead 7 includes a base piece 8 connected to the frame 3 and a pair of abutting pieces (ends) 9. The pair of the abutting pieces 9 extend obliquely downward from the end of the base piece 8 in a bilaterally symmetry manner.

Similar to the above, the ends of the paired leads 5 extending from the lower side of the frame 3 are jointed to the paired external terminals 27 of the product insulating part 21, respectively, in the plurality of wiring boards 20a. The plurality of wiring boards 20a does not have the conductor 34 in their dummy insulating parts 22 as illustrated in the left side in FIG. 3. A pair of right and left corners in the dummy insulating part 22 is brought into contact with the inner side of the pair of the abutting pieces 9, respectively. The wiring boards 20a are also connected to the upper side of the frame 3 through the friction of respective contact parts.

The other wiring board unit 1b includes a lead frame 2b and a plurality of wiring boards 20a, which are similar to those described above, as partially illustrated in the right side in FIG. 3. The wiring boards 20a are disposed within the opening 4 of the frame 3. The wiring board unit 1b has a plurality of abutting leads (a connection unit) 7a. The abutting leads 7a are provided at the upper side of the frame 3 in the lead frame 2b. Each abutting lead 7a includes the base piece 8, a pair of right and left abutting pieces 9, and connection pieces (tips) 10. The connection piece 10 is provided at the end of each abutting piece 9 and extends downward in the figure.

Similarly to the above, the ends of the paired leads 5 extending from the lower side of the frame 3 are jointed to a pair of the external terminals 27 of the product insulating part 21, respectively, in the plurality of wiring boards 20a. In the plurality of wiring boards 20a, as illustrated in the right side in FIG. 3, a pair of the right and left contact pieces 10 of each abutting lead 7a line-contact to the right and left side surfaces of the dummy insulating part 22. Further, the pair of the right and left contact pieces 10 clips the upper part of the dummy insulating part 22 from the left and the right. Thereby, each wiring board 20a is also connected to the upper side of the frame 3.

Figure 4A:
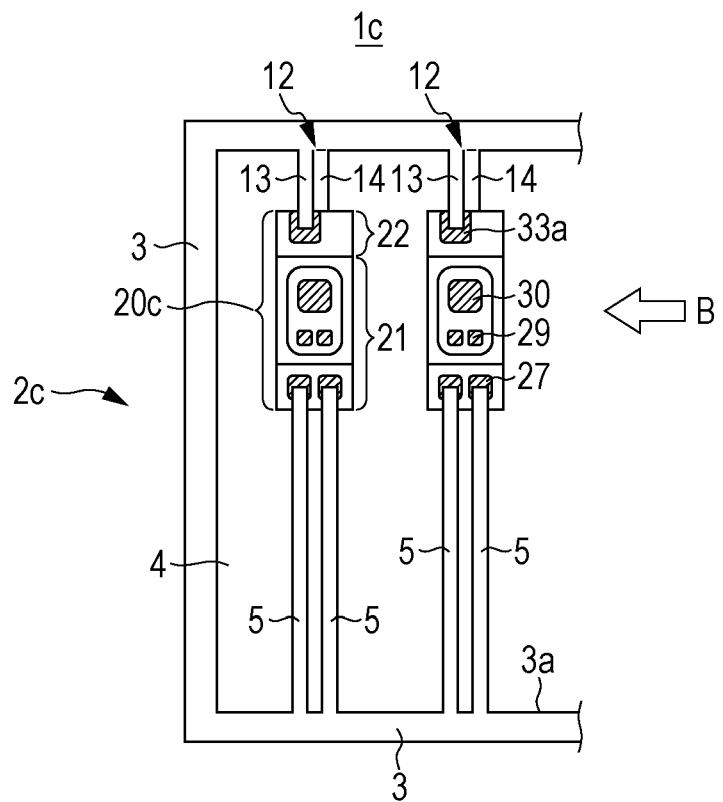
FIG. 4A is a partial top view of a further different form of a wiring board unit.
Figure 4B:
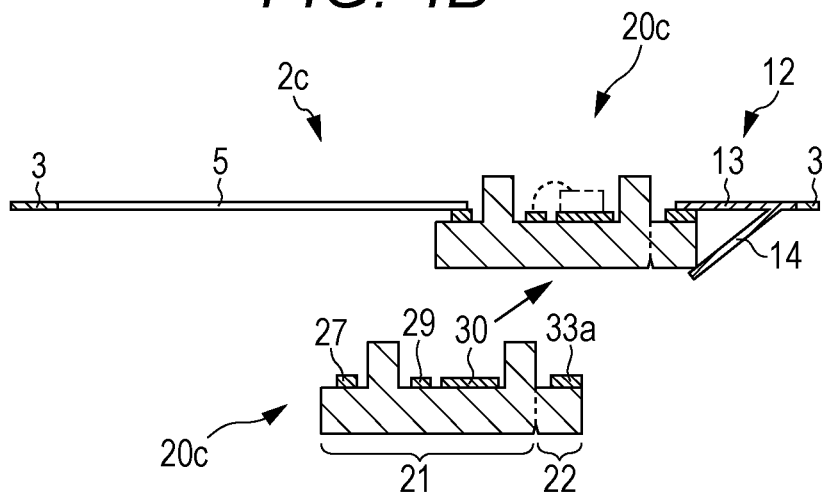
FIG. 4B is a vertical sectional view taken along a white arrow B in FIG. 4A.

FIG. 4A is a partial top view of a wiring board unit 1c. FIG. 4B is a vertical sectional view taken along a white arrow B in FIG. 4A.

The wiring board unit 1c also includes a lead frame 2c and a plurality of wiring boards 20c, which are similar to those as described above, as illustrated in FIG. 4A. The wiring board 20c is disposed within the opening 4 of the frame 3. The lead frame 2c includes a plurality of clipping leads (a connection unit) 12 in place of the connection leads 6. The plurality of clipping leads (a connection unit) 12 extend from the inner edge 3a of the opening 4 at the upper side of the frame 3 upward of each wiring board 20.

Each clipping lead 12 includes a pair of right and left clipping pieces 13 and 14 in the top view as illustrated in FIG. 4A and FIG. 4B. While the left clipping piece 13 is located at the same level as the frame 3, the right clipping piece 14 extends obliquely downward from the inner edge of the opening 4 at the upper side of the frame 3.

On the other hand, the wiring boards 20c do not have the conductor 34 on the surface of the dummy insulating part 22 as illustrated in FIG. 4A and FIG. 4B. A protruding part 33a made of the same insulating material as the dummy insulating part 22 is formed on the surface of the dummy insulating part 22 in the wiring board 20c. The height of the protruding part 33a is the same as the thickness of the conductor 34.

The wiring board unit 1c is formed as follows. Specifically, as represented by the arrow in FIG. 4B, the wiring board 20c is lifted obliquely upward to the bottom (the back surface) of the lead frame 2c. The protruding part 33a and the back surface of the dummy insulating part 22 are clipped between the clipping piece 13 and the clipping piece 14 of the clipping lead 12. Then, similarly to the above, the ends of the paired leads 5 extending from the lower side of the frame 3 are jointed to the pair of the external terminals 27 of the product insulating part 21, respectively. Thereby, the wiring board unit 1c is formed.

The whole of or the end side of the upper clipping piece 13 may be slightly bent downward in side view so that the protruding part 33a in the wiring board 20c side can be omitted. Further, the pair of the clipping pieces 13 and 14 may be formed to the frame 3 slightly distant to each other.

Figure 5A:
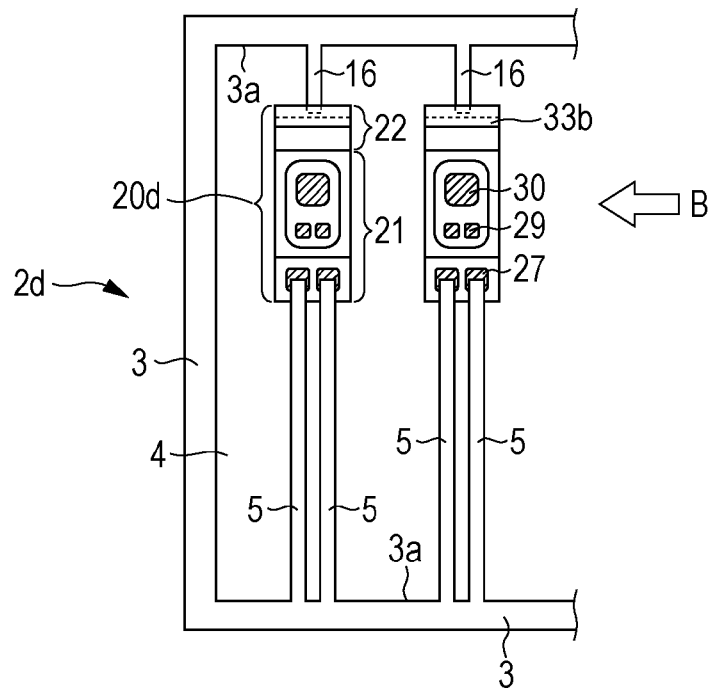
FIG. 5A is a partial top view of a wiring board unit according to another embodiment.
Figure 5B:
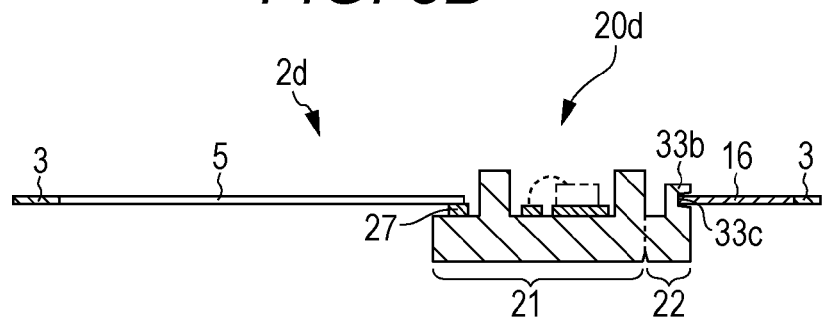
FIG. 5B is a vertical sectional view taken along a white arrow B in FIG. 5A.
Figure 5C:
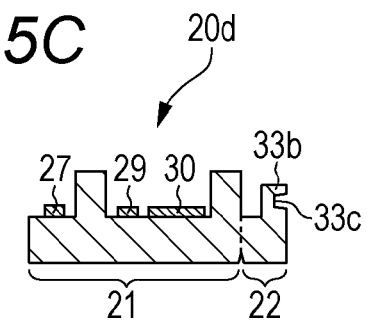
FIG. 5C is a sectional view of a wiring board.

FIG. 5A is a partial top view of a wiring board unit 1d according to another embodiment of the disclosure. FIG. 5B is a vertical sectional view taken along a white arrow B in FIG. 5A. FIG. 5C is a vertical sectional view of a wiring board 20 used in the wiring board unit 1d. As illustrated in FIG. 5A, the wiring board unit 1d also has the same lead frame 2d as described above and the same plurality of wiring boards 20d as described above. The wiring board 20d is disposed within the opening 4 of the frame 3. The lead frame 2d has protruding leads (a connection unit) 16 similar to the connection leads 6 at the inner edge 3a of the opening 4 in the upper side of the frame 3. On the other hand, as illustrated in FIG. 5C, the wiring board 20d includes the product insulating part 21 and the dummy insulating part 22 similarly to the above. The surface 33 of the dummy insulating part 22 does not have the conductor 34. The surface 33 of the dummy insulating part 22 is provided with a protruding part 33b along the upper side of the surface and a recessed groove (a recess: a connection unit) 33c opened outward of the protruding part 33b.

The wiring board unit 1d is formed as follows. That is, as illustrated in FIG. 5B, the end of the protruding lead 16 extending from the upper side of the frame 3 is inserted in the recessed groove 33c of each wiring board 20d. Then, similarly to the above, the ends of the paired leads 5 extending from the lower side of the frame 3 are jointed to the pair of the external terminals 27 of the product insulating part 21, respectively. Thereby, the wiring board unit 1d is formed.

The dummy insulating part 22 of the wiring board 20d may be formed in a thick plate of the same thickness as the product insulating part 21. In this case, the recessed groove 33c may be formed at the upper part of the outer circumference side of the dummy insulating part 22. Alternatively, it is possible that a local recess in place of the recessed groove 33c is provided to the dummy insulating part 22 and the protruding lead with the tapered end is inserted in the recess.

Figure 6:
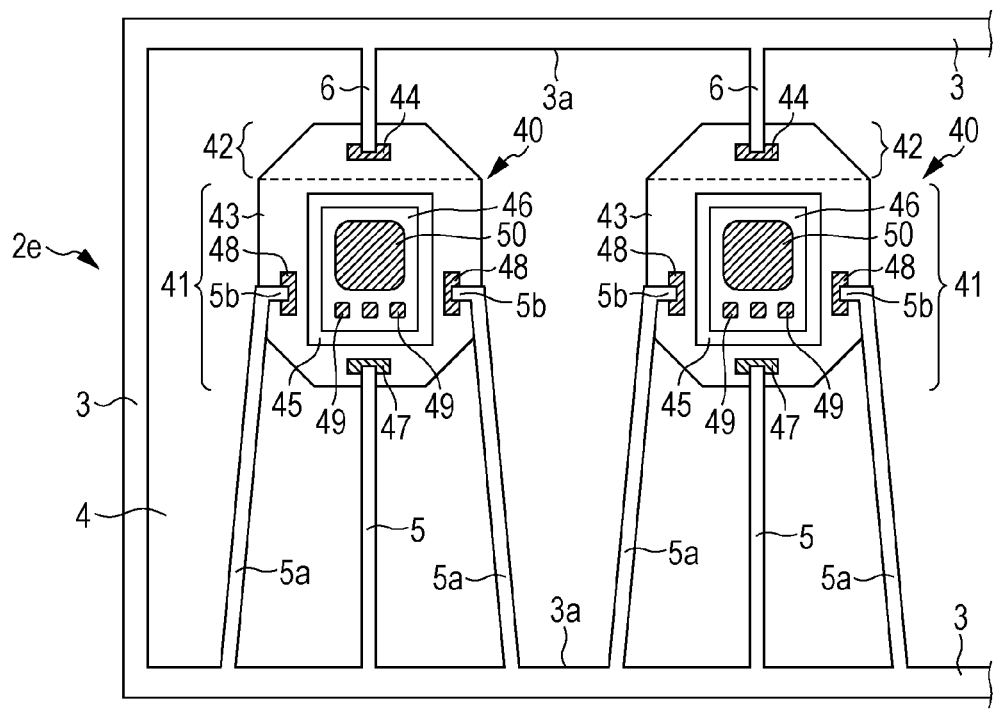
FIG. 6 is a partial top view of a wiring board unit according to a still another embodiment.

FIG. 6 is a partial top view of a further different form of a wiring board unit 1e. As illustrated in FIG. 6, the wiring board unit 1e has the same lead frame 2e as described above and a plurality of wiring boards 40. The wiring boards 40 are disposed within the opening 4 of the frame 3. The lead frame 2e has the same frame 3 as described above, a lead 5, a pair of right and left leads 5a, and the same connection leads 6 as described above. The lead 5 extends similarly to the above from the inner edge 3a within the opening 4 at the lower side of the frame 3. The right and left leads 5a in the pair are located at opposite sides of the lead 5, respectively. The pair of the right and left leads 5a extends obliquely from the inner edge 3a in a bilaterally symmetry manner. The ends 5b of the leads 5a are bent. The connection leads 6 extend vertically from the inner edge 3a of the upper side of the frame 3. The lead 5 and the pair of the right and left leads 5a interposing the lead 5 are a plurality of leads that correspond to respective wiring boards 40.

On the other hand, the wiring board 40 is formed by stacking the same plurality of ceramic layers as described above. The wiring board 40 has an irregular octagonal shape with eight sides in top view. The wiring board 40 has an irregular hexagon product insulating part 41 and a dummy insulating part 42. The irregular hexagon product insulating part 41 is located under the border depicted by the virtual dashed line of FIG. 6 and has five sides. The dummy insulating part 42 is located in the upper side of the border and has three sides. The dummy insulating part 42 is shaped in a trapezoid in top view. It is noted that the back surface of the wiring board 40 may be provided with the same dividing groove as described above that partitions the product insulating part 41 from the dummy insulating part 42.

As illustrated in FIG. 6, the product insulating part 41 has a side wall 45 shaped in a rectangular frame in top view and an inside cavity 46 at the center of a surface Furthermore, the product insulating part 41 has an external terminal 47 and a pair of external terminals 48. The external terminal 47 is formed horizontally near the lower side of the surface 43 in FIG. 6. Each of the pair of the external terminals 48 is formed vertically near the right and left sides of the surface 43 in FIG. 6. There are three internal terminals 49 and one rectangular element mounting part 50 formed on the bottom of the cavity 46. The three internal terminals 49 are conducted to the external terminals 47 and 48, respectively, via the same internal wirings (not shown) as described above.

On the other hand, the dummy insulating part 42 has a conductor 44 that is formed horizontally near the upper side of the surface 43 in FIG. 6.

The wiring board unit 1e is then formed as follows similarly to the wiring board unit 1. That is, as illustrated in FIG. 6, the end of the lead 5 extending inward in the opening 4 from the inner edge 3a of the lower side of the frame 3 is jointed to the external terminal 47 of the product insulating part 41 of each wiring board 40. Further, the ends of the paired leads 5a are jointed to the pair of the external terminals 48 in the product insulating part 41, respectively. Furthermore, the end of the connection lead 6 extending inward in the opening 4 from the inner edge 3a of the upper side of the frame 3 is jointed to the conductor 44 of the dummy insulating part 42 of each wiring board 40. Thereby, the wiring board unit 1e is formed.

It is noted that the abutting leads 7 and 7a, the clipping lead 12, or the protruding lead 16, in place of the connection lead 6 of the lead frame 2e, may be formed to the same position. In the case that the protruding lead 16 is formed, the recess into which the end of the protruding lead 16 can be inserted may be provided to the dummy insulating part 42.

In the wiring board units 1 and 1a to 1e as described above, the plurality of wiring boards 20, 20a, 20c, 20d, and 40 are disposed within the opening 4 of the lead frames 2 and 2a to 2e. Furthermore, the plurality of external terminals 27, 47, and 48 are formed on the surfaces 26 and 43 of the product insulating parts 21 and 41 of the wiring boards 20, 20a, 20c, 20d, and 40. The external terminals 27, 47, and 48 are jointed to the ends of the plurality of leads 5 and 5a extending from the inner edge 3a of the opening 4, respectively. Furthermore, the dummy insulating parts 22 and 42 of the wiring boards 20, 20a, 20c, 20d, and 40 are connected to the inner edge 3a of the frame 3 via the connection unit (the connection lead 6, the abutting leads 7 and 7a, the clipping lead 12, and the protruding lead 16 and recessed groove 33c).

This results in preventing or significantly suppressing such situation at the manufacturing that the wiring boards 20, 40, and the like swing in the plating solution due to the flow of the plating solution in the plating step after the mounting step for mounting the wiring boards 20, 20a, 20c, 20d, and 40 within the opening 4 of the frame 3. Further, this also prevents or suppresses the bending of the leads 5 and 5a when the lead frames 2 and 2a to 2e, on which the wiring boards 20, 40, and the like, are mounted, are connected to and removed from the plating electrode (the power supply).

Furthermore, such deformation that the plurality of leads 5 and 5a connected to the external terminals 27, 47, and 48 of the wiring boards 20, 20a, 20c, 20d, and 40 are undesirably bent is unlikely to occur after the mounting step and/or at the conveyance steps between respective steps.

Therefore, this ensures to provide the wiring board units 1 and 1a to 1e that have the lead frames 2 and 2a to 2e and the plurality of wiring boards 20 and 20a, 20c, 20d, and 40 and are superior in the morphological stability and the dimensional accuracy. In the wiring boards 20, 20a, 20c, 20d, and 40 of the wiring board units 1 and 1a to 1e, the external terminals 27, 47, and 48 of the product insulating parts 21 and 41 are connected to the plurality of leads 5 and 5a extending inward the opening 4 of the frame 3 and having a predetermined shape. Moreover, the dummy insulating parts 22 and 42 are connected to the frame 3 via the connection unit.

It is noted that more than one type of the connection unit, that is, the connection lead 6, the abutting leads 7 and 7a, the clipping lead 12, and the protruding lead 16 and recessed groove 33c may be provided together to the inner edge 3a of the frame 3 of the same lead frames 2 and 2a to 2e. Further, the recessed groove that the inner surface of the abutting leads 7 and 7a are able to enter may be provided in the outer circumference surface of the dummy insulating parts 22 and 42 of the wiring boards 20, 20a, 20c, 20d, and 40.

The manufacturing method of the wiring board unit 1 will be described below.

Figure 7:
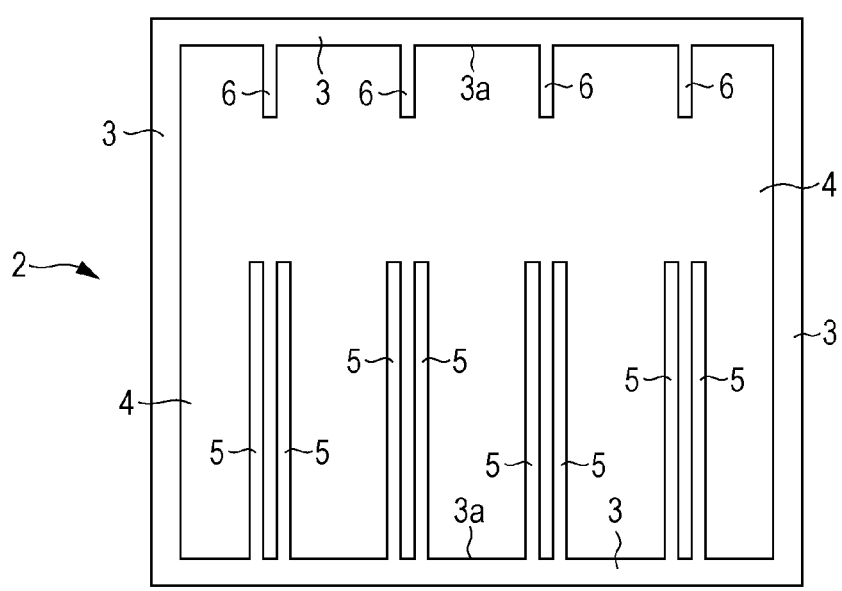
FIG. 7 is a schematic diagram illustrating a step in a manufacturing method of a wiring board unit according to the present disclosure.

The lead frame 2 as illustrated in FIG. 7 is prepared in advance. In order to obtain the lead frame 2, a band-shaped metal thin plate (not shown) that is made of Alloy 42, for example, and is continuous along the lateral direction is prepared. A punch and die having a predetermined cross section form (pattern) is used to apply a punching to the metal thin plate. This punching is applied along the longitudinal direction of the metal thin plate for multiple times. Next, the metal thin plate is cut for each punched area. As a result, the lead frame 2 as illustrated in FIG. 7 is obtained. This lead frame 2 has the frame 3 having the opening 4, a plurality of leads 5, and four connection leads 6. The opening 4 is formed inside the frame 3 and has a similar figure to the outer shape of the frame 3 in top view. With respect to the plurality of leads 5, four sets of two mutually adjacent leads 5 extend inward in the opening 4 vertically from the inner edge 3a of the lower side of the frame 3. The connection leads 6 extend inward in the opening 4 vertically from the inner edge 3a of the upper side of the frame 3 so as to substantially face respective sets of the leads 5.

It is noted that, in the step of preparing each of the lead frames 2a to 2e, the punch and die having the different sectional shape from that in the case of the lead frame 2 may be used. In this case, the lead frames 2a to 2e can be formed similarly to the lead frame 2.

A step of preparing the wiring boards 20 is performed in parallel to the preparation of the lead frame 2.

Four green sheets whose main component is alumina are prepared in advance. Among these green sheets, two of them which will be the ceramic layers s1 and s2 are left. A punching is applied to the rest of two green sheets that will be the ceramic layers s3 and s4. This punching uses the die having the rectangle punching hole in top view and the punch having a smaller rectangular cross section in top view. By this punching, formed are two frame-shaped green sheets formed in a rectangular frame in top view. The cavity 28 will be formed to the inside of these two frame-shaped green sheets.

Next, a punching by a small diameter punch is applied to the flat green sheet which will be the ceramic layer s2 of the two green sheets which will be the ceramic layers s1 and s2. Thereby, a plurality of via holes is formed in the green sheet. Each via hole is filled with a conductive paste containing W powder or Mo powder. Consequently, a plurality of unsintered via-conductors that will be a part of the internal wiring 32 is formed. Next, the same conductive paste as described above is printed with a predetermined pattern by screen-printing at a predetermined position on the surface of the green sheet in which the via-conductors are formed. Thereby, a plurality of unsintered conductive layers are formed that will be the external terminals 27, the inner terminals 29, the element mounting part 30, and the conductor 34.

Furthermore, the same conductive paste as described above is screen-printed on the surface of the flat green sheet which will be the ceramic layer s1. Thereby, a plurality of unsintered wiring layers as described above are formed that will be a part of the internal wiring 32. In addition, the dividing groove 23 having a V-shaped cross section is formed in the back surface of that green sheet by inserting a knife along the width direction of the back surface.

Next, the two flat green sheets and the two frame-shaped green sheets are stacked so that the ceramic layers s1 to s4 are stacked in this order from the bottom, and further pressured. Thereby, the green sheet stack is obtained. Then, a degreasing step and a sintering step are sequentially applied to the obtained green sheet stack.

Figure 8A:
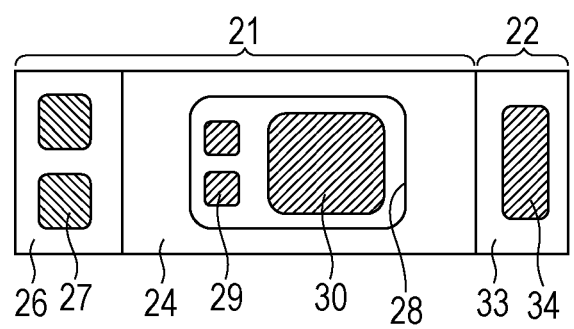
FIGS. 8A and 8B are schematic diagrams illustrating steps in the manufacturing method, which are different from the above step.
Figure 8B:
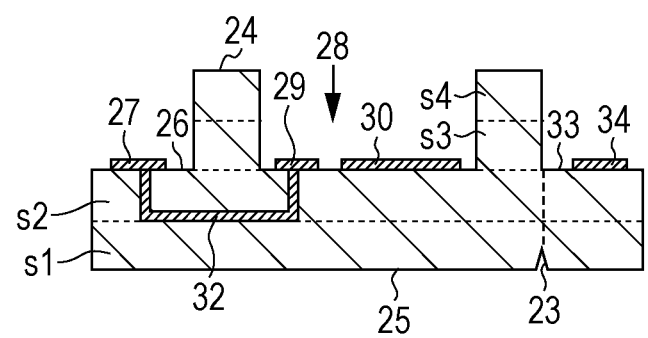

As a result, the wiring board 20 as illustrated in the top view of FIG. 8A and the vertical sectional view of FIG. 8B is formed (prepared). In the wiring board 20, the ceramic layers s1 to s4 are stacked. Furthermore, the product insulating part 21 and the dummy insulating part 22 are neighbor to each other interposing the dividing groove 23 in the back surface. The wiring board 20 has a pair of the external terminals 27, a pair of the internal terminals 29 and one element mounting part 30, a pair of the internal wirings 32, and the conductor 34. The pair of the external terminals 27 is located on the surface 26 of the thin part of the product insulating part 21. The pair of the internal terminals 29 and the one element mounting part 30 is located in the bottom of the cavity 28. The pair of the internal wirings 32 provides conduction between the external terminals 27 and the internal terminals 29. The conductor 34 is located on the surface of the dummy insulating part 22.

It is noted that the same internal wiring as described above that provide conduction between the element mounting part 30 and the conductor 34 may be formed within the wiring board 20 so as to bridge the product insulating part 21 and the dummy insulating part 22. Further, the step of preparing the wiring board 20 may be done in the form for taking multiple pieces.

Figure 9A:
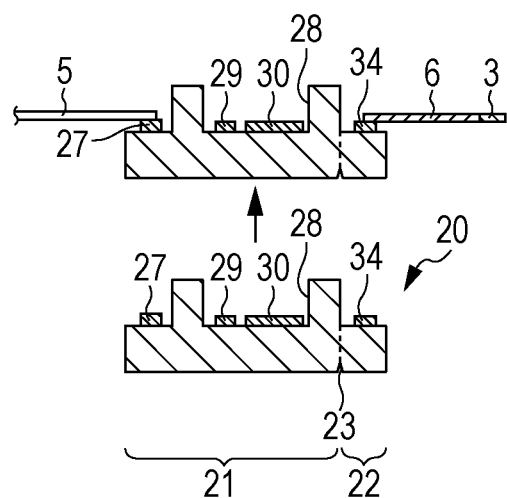
FIGS. 9A and 9B are schematic diagrams each illustrating the mounting step and the plating step in the manufacturing method of a wiring board.

Next, the step of mounting four wiring boards 20 to the lead frame 2 is performed. Specifically, as represented by the arrow in FIG. 9A, the pair of the external terminals 27 of the product insulating part 21 of each wiring board 20 are brazed to the ends of the paired leads 5 extending inward in the opening 4 from the lower side of the frame 3 of the lead frame 2, respectively, via the same Ag brazing as described above (not shown). Furthermore, the end of the connection lead 6 extending inward the opening 4 from the upper side of the frame 3 is brazed to the conductor 34 of the dummy insulating part 22 of each wiring board 20 similarly to the above.

Figure 9B:
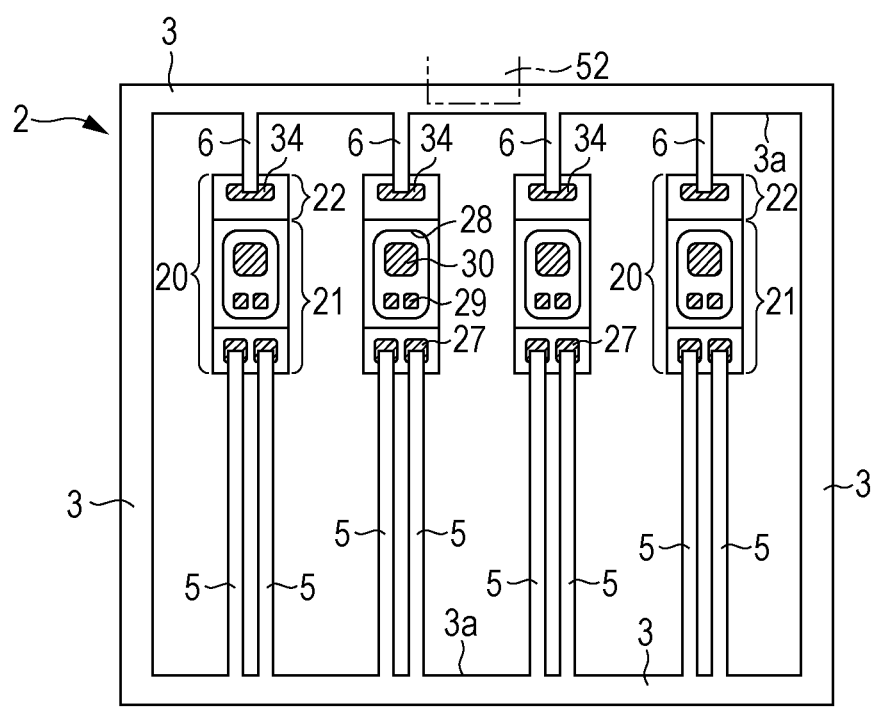

As a result, as illustrated in FIG. 9B, an unplated wiring board unit (1) having the lead frame 2 and four wiring boards 20 are obtained. In the unplated wiring board unit (1), respective ends of the pair of the leads 5 and the connection lead 6 extending inward in the opening 4 of the frame 3 are jointed to the product insulating part 21 and the dummy insulating part 22, respectively. Therefore, four wiring boards 20 are mounted within the opening 4 of the lead frame 2.

Furthermore, as illustrated in FIG. 9B, the upper side of the frame 3 of the lead frame 2 of the wiring board unit (1) is connected to a plating electrode (power supply) 52. Furthermore, an electro Ni plating and electro Au plating (plating steps) are sequentially applied to the wiring board unit (1). In the electro Ni plating, the wiring board unit (1) is immersed in the electro Ni plating solution. In the electro Au plating, the wiring board unit (1) is immersed in the electro Au plating solution.

As a result, all the exposed surfaces of the lead frame 2 and the surfaces of the external terminals 27, the internal terminals 29, and the conductor 34 of each wiring board 20 are coated with the plating layer (not shown) made of a Ni plating film and an Au plating film. Thereby, the wiring board unit 1 illustrated in FIG. 1 can be obtained.

It is noted that, in order to coat the surface of the element mounting part 30 with the plating layer, an electroless Ni plating and an electroless Au plating may be applied on the surface of the element mounting part 30. Alternatively, the surface of the element mounting part 30 may be coated with the above-described plating layer by applying the same electro Ni plating and electro Au plating as described above with utilizing the internal wiring that provides conduction between the element mounting part 30 and the conductor 34.

The wiring board 20 is connected to the lower side of the frame 2 via the pair of the leads 5. Further, the wiring board 20 is connected to the upper side of the frame 2 via the connection leads 6. Furthermore, the pair of the leads 5 and the connection lead 6 face each other within the opening 4. Therefore, at the immersion to the electro Ni plating solution and the electro Au plating solution, the flow of the plating solution is unlikely to cause the deformation such as the bending at each of the leads 5 and 6.

Furthermore, even at the conveyance of the wiring board unit (1) in the transferring from the mounting step to the plating step and/or at the connection (at the racking) of the wiring board unit (1) to the plating electrode 52 and at the removal (at the unracking) thereof from the plating electrode 52, the deformation such as the undesired bending is unlikely to occur at the wiring board unit (1) or the leads 5 and 6 before and after the plating.

According to the manufacturing method of the wiring board unit 1 as described above, the lead frame 2 and the wiring board 20 are prepared in each preparing step. In the mounting step, the pair of the external terminals 27 formed on the surface of the product insulating part 21 of the wiring board 20 is jointed to the ends of the paired leads 5 extending inward in the opening 4 from the frame 3, respectively. Furthermore, the conductor 34 formed on the surface of the dummy insulating part 22 of the wiring board 20 is connected to the end of the connection lead 6 extending inward in the opening 4 from the frame 3. This results in preventing or significantly suppressing such situation that the wiring board 20 and the pair of the leads 5 connected thereto swing in the plating solution even when there is a flow of the plating solution. Moreover, the bending of respective leads 5 and 6 can be prevented or suppressed when the lead frame 2 on which the wiring board 20 is mounted is connected to and removed from the plating electrode 52. Furthermore, such deformation that respective leads 5 and 6 connected to the wiring board 20 are undesirably bent is unlikely to occur in the conveyance after the mounting step and/or between respective steps.

This ensures to manufacture the wiring board unit 1 that is superior in the morphological stability and the dimensional accuracy, having the lead frame 2 and the wiring boards 20. In the wiring board 20, the product insulating part 21 is connected to the pair of the leads 5 extending inward the opening 4 inside the frame 3, and the dummy insulating part 22 is connected to the frame 3 via the connection lead 6.

Figure 10A:
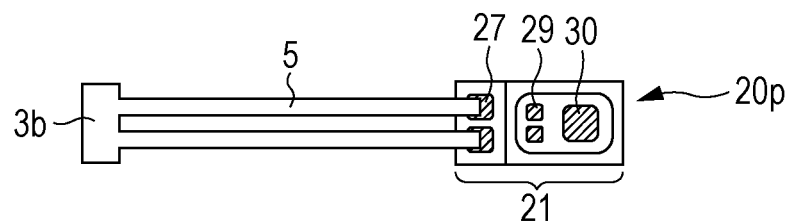
FIGS. 10A and 10B are top views of a wiring board with lead obtained by the above manufacturing method.

The wiring board with lead 36 illustrated in the top view of FIG. 10A includes a wiring board 20p having the product insulating part 21 only, a pair of the leads 5 connected to the external terminals 27, and a partial frame 3b. The wiring board with lead 36 is obtained by a cutting step applied to the wiring board unit 1. This cutting step includes cutting and removing the dummy insulating part 22 from the wiring board 20 along with the dividing groove 23 and cutting two points of (a part of) the lower side of the frame 3 adjacent to the pair of the leads 5. Thereby, four wiring boards with lead 36 are obtained from one wiring board unit 1, for example.

Furthermore, another cutting step is applied to the wiring board with lead 36. In this cutting step, the partial frame 3b and a pair of adjacent base ends of the leads 5 are cut and removed from the wiring board with lead 36.

Figure 10B:
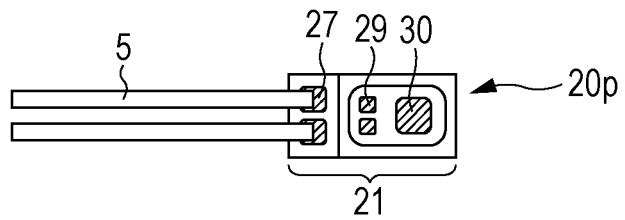

As a result, as illustrated in FIG. 10B, the wiring board with lead 38 including the pair of the leads 5 having a desired length is obtained. In the wiring board with lead 38, the electronic part 31 is mounted on the surface of the element mounting part 30. Furthermore, respective electrodes of the electronic part 31 and the pair of the internal terminals 29 are conducted via the wires w, respectively. This allows the wiring board with lead 38 to be arranged in a predetermined part in various electronic devices and the like.

The mounting step for obtaining the wiring board unit 1a to 1d will be described below. The same lead frames 2a to 2d and plurality of wiring boards 20a, 20c, and 20d as described above are prepared in advance, respectively.

Figure 11A:
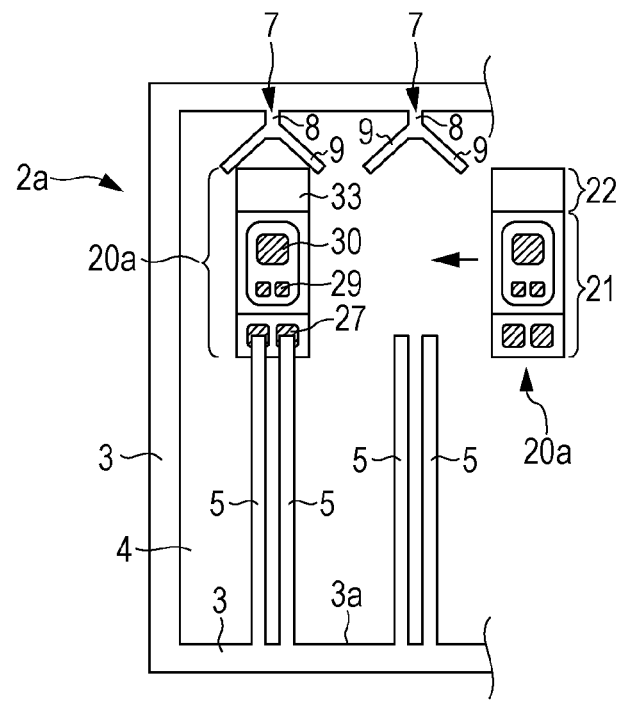
FIGS. 11A and 11B are schematic diagrams each illustrating a mounting step of a different form of a wiring board.

As illustrated in FIG. 11A, a pair of the abutting pieces 9 configures the plurality of abutting leads 7 provided to the upper side of the frame 3 of the lead frame 2a. A pair of the right and left corners in the dummy insulating part 22 of each wiring board 20a to be mounted is contacted to the inner surface of each of the pair of the abutting pieces 9, respectively. In this state, the ends of the paired leads 5 extending from the lower side of the frame 3 are jointed to the pair of the external terminals 27 formed in the product insulating part 21 of each wiring board 20a. Furthermore, a plurality of wiring boards 20a is disposed within the opening 4 of the lead frame 2. Thereby, the unplated wiring board unit 1a is obtained.

Figure 11B:
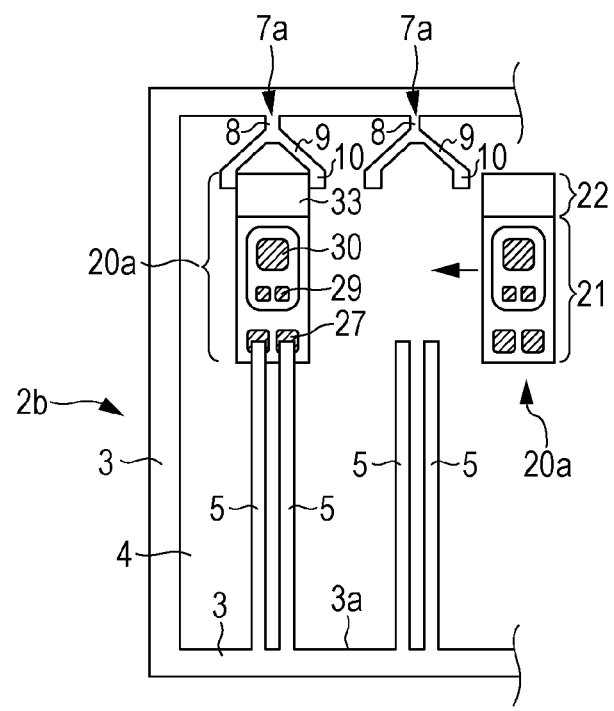

Further, as illustrated in FIG. 11B, a plurality of abutting leads 7a are provided to the upper side of the frame 3 of the lead frame 2b. The right and left side surfaces adjacent to the pair of the right and left corners in the dummy insulating part 22 of each wiring board 20 to be mounted are line-contacted to a pair of the contact pieces 10 of the abutting leads 7a. This causes the pair of the contact pieces 10 to clip the upper part of the dummy insulating part 22 from the left and the right. In this state, the ends of respective leads 5 are jointed to respective external terminals 27 of the wiring board 20a, respectively, similarly to the above. Thereby, the unplated wiring board unit 1b is obtained.

Figure 12A:
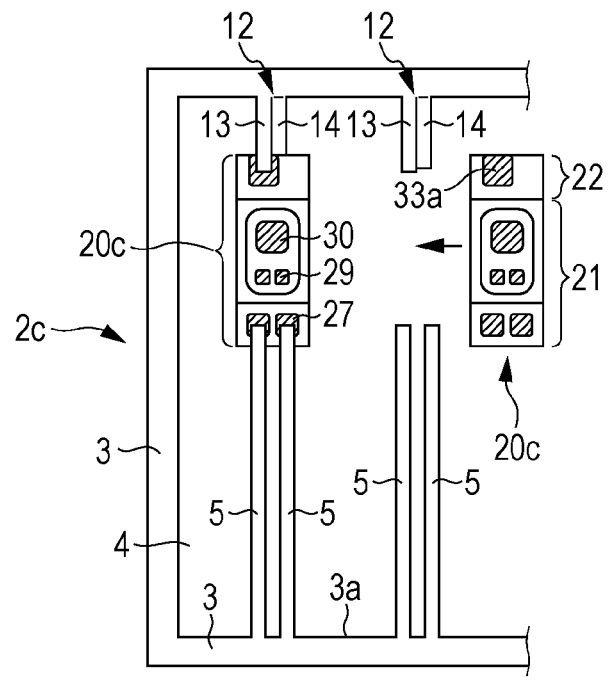
FIGS. 12A and 12B are schematic diagrams each illustrating a mounting step of a further different form of a wiring board.

Furthermore, as illustrated in FIG. 12A, a plurality of clipping leads 12 are provided to the upper side of the frame 3 of the lead frame 2c. The part close to the protruding part 33a of the dummy insulating part 22 of each wiring board 20c to be mounted is clipped between a pair of the clipping piece 13 and the clipping piece 14 of the clipping lead 12. In this state, the ends of respective leads 5 are individually jointed to respective external terminals 27 of the wiring board 20, similarly to the above. Thereby, the unplated wiring board unit 1c is obtained.

Figure 12B:
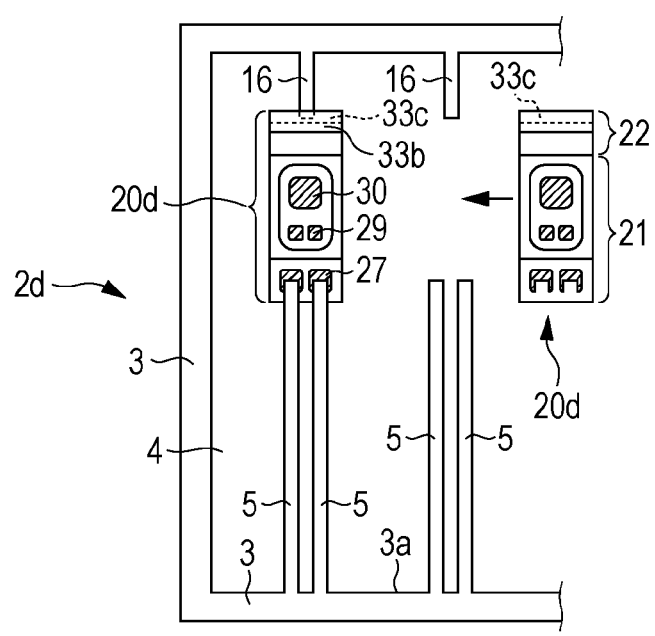

In addition, as illustrated in FIG. 12B, a plurality of protruding leads 16 are provided to the upper side of the frame 3 of the lead frame 2d. The end of the protruding lead 16 is inserted in the recessed groove 33c opened outward the dummy insulating part 22 of each wiring board 20d to be mounted. In this state, the ends of respective leads 5 are individually jointed to respective external terminals 27 of the wiring board 20d, similarly to the above. Thereby, the unplated wiring board unit 1d is obtained.

The wiring board units 1a to 1d illustrated in FIG. 3 to FIG. 5 are obtained by further applying the same plating step as described above to the unplated wiring board units 1a to 1d.

It is noted that the wiring board unit 1e illustrated in FIG. 6 can also be obtained after the lead frame 2e and the plurality of wiring boards 40 experience respective preparing step, mounting step, and plating step similar to those applied to the wiring board unit 1.

The manufacturing method of the wiring board units 1a to 1e as described above allows for the same effect and the same advantage as described above for the manufacturing method of the wiring board unit 1.

It is noted that a plurality of wiring boards with lead 36 and 38 similar to those in FIG. 10A and FIG. 10B can be manufactured by applying the same cutting step as described above to the plated wiring board units 1a to 1e.

The present disclosure is not limited to each form described above.

For example, the lead frame may be the one obtained by punching the thin plate made of copper alloy such as 194 alloy, Kovar, stainless steel, or the like with a predetermined pattern.

Further, the outer shape of the frame and the opening located inside the frame may be a similar figure of a triangle, or a regular polygon or an irregular polygon that has five or more sides in top view. Further, the outer shape of the frame and the shape of the opening may be a similar figure of a circle, an oval, an ellipse, and the like.

Furthermore, a plurality of openings may be arranged in one lead frame. In this case, one or a plurality of wiring boards may be arranged in each opening.

Further, the number of the plurality of leads may be four or more. These leads may extend inward in the opening at any angle from the inner edge of the different side of the frame. Furthermore, the end of these leads may extend close to the plurality of external terminals in the product insulating part of the same wiring board.

Furthermore, in each of the above-described forms, the plurality of leads are arranged to substantially face the connection lead, the clipping lead, or the protruding lead within the opening surrounded by the frame, but the arrangement is not limited to the above. The plurality of leads and the connection lead, the clipping lead, or the protruding lead may be arranged to intersect at an obtuse angle between 90 and 180 degrees within the opening if they were extended.

Further, the outer shape of the wiring board may be a triangle, a regular polygon or an irregular polygon having five or more sides. Alternatively, the wiring board may be shaped in a flat plate without the cavity.

Furthermore, the wiring board may include the product insulating part and the dummy insulating part made of resin such as epoxy-based resin, for example. In this case, the conductive part such as the external terminal and the conductor may be formed by various lithography techniques.

In addition, an adhesive agent may be further applied to the part where the abutting leads 7 and 7a, the clipping lead 12, and the protruding lead 16 are contacted with the outer circumference surface or the recessed groove 33c of the dummy insulating part 22.

The present disclosure ensures to provide the wiring board unit in which the leads are unlikely to be bent in the plating step even when the wiring board to be arranged within the opening of the lead frame is mounted in a cantilevered manner by a plurality of leads extending from the inner edge of the opening, the manufacturing method for certainly obtaining the wiring board unit, and the manufacturing method of the wiring board with lead subsequently obtained after the above manufacturing method.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A wiring board unit comprising:
    a wiring board having at least three sides and a polygonal shape in top view, the wiring board including a product insulating part comprising a plurality of external terminals, and a dummy insulating part at an outer edge of one of the at least three sides; and
    a lead frame including a frame having an inner edge defining an opening within which the wiring board is disposed in top view, and a plurality of leads, one end of each of the plurality of leads connected to the inner edge of the frame and the other end of each of the plurality of leads respectively connected to one of the plurality of external terminals of the wiring board,
    wherein a connection unit for connecting the frame of the lead frame and the dummy insulating part of the wiring board is arranged therebetween; and
    wherein the connection unit is any one of a connection lead extending inward in the opening from the inner edge of the frame and joined to a conductor of the dummy insulating part of the wiring board, an abutting lead extending inward in the opening from the inner edge of the frame and having an end abutted on a plurality of outer circumference surfaces of the dummy insulating part, a clipping lead extending inward in the opening from the inner edge of the frame and clipping the dummy insulating part in a thickness direction, and a protruding lead extending inward in the opening from the inner edge of the frame and having an end inserted in a recess opened outward of the dummy insulating part.

2. A method of manufacturing the wiring board unit of claim 1, the method comprising:
    preparing the lead frame;
    preparing the wiring board;
    mounting the wiring board within the opening of the frame by respectively joining each of the plurality of external terminals of the wiring board to the one end of each of the plurality of leads; and
    coating a surface of the frame and a surface of the plurality of leads with a plating film by connecting the frame of the lead frame to a plating power source,
    wherein, in the mounting of the wiring board, a connection unit for connecting the inner edge of the frame and the dummy insulating part of the wiring board is arranged therebetween.

3. The method of manufacturing a wiring board unit according to claim 2, wherein the connection unit is any one of a connection lead extending inward in the opening from the inner edge of the opening of the frame and joined to a conductor of the dummy insulating part of the wiring board, an abutting lead extending inward in the opening from the inner edge of the frame and having an end abutted on a plurality of outer circumference surfaces of the dummy insulating part, a clipping lead extending inward in the opening from the inner edge of the frame and clipping the dummy insulating part in a thickness direction, and a protruding lead extending inward in the opening from the inner edge of the frame and having an end inserted in a recess opened outward of the dummy insulating part.

4. The method of manufacturing a wiring board according to claim 2, further comprising:
    cutting out the wiring board having the product insulating part only, by cutting at least a part of the frame to sever the plurality of leads, and by removing the dummy insulating part from the wiring board.

* * * * *